(12) United States Patent  (10) Patent No.: US 8,541,165 B2
Sato                       (45) Date of Patent:     Sep. 24, 2013

(54) RESIN FILM FORMING METHOD

(75) Inventor: Tomomi Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 176 days.

(21) Appl. No.: 13/156,193

(22) Filed: Jun. 8, 2011

(65) Prior Publication Data

US 2011/0305995 A1   Dec. 15, 2011

(30) Foreign Application Priority Data

Jun. 15, 2010 (JP) ................. 2010-136386

(51) Int. Cl.
*G03F 7/26* (2006.01)
(52) U.S. Cl.
USPC ......................................... 430/327; 430/322
(58) Field of Classification Search
USPC ................................ 430/329, 330
See application file for complete search history.

(56) References Cited

U.S. PATENT DOCUMENTS 5,849,435 A * 12/1998 Akram et al. ............ 430/3

FOREIGN PATENT DOCUMENTS

| JP | 6-163389 A | 6/1994 |
| JP | 2000-195126 A | 7/2000 |
| JP | 2001-68393 A | 3/2001 |
| JP | 2006-80298 A | 3/2006 |

* cited by examiner

*Primary Examiner* — Kathleen Duda
(74) *Attorney, Agent, or Firm* — Fujitsu Patent Center (57) ABSTRACT

A resin film forming method for forming a resin film on a substrate includes forming an intermediate layer on the substrate which includes an inorganic composition as a main component to chemically bond the resin film to be formed on the substrate to the substrate, carrying out a treatment on the substrate to remove an edge of the intermediate layer from an edge of the substrate, forming the resin film on the substrate by spin coating, chemically bonding the resin film to the substrate and hardening the resin film, and removing an edge of the resin film from the edge of the substrate by applying vibrations to the hardened resin film.

7 Claims, 7 Drawing Sheets

RESIN FILM FORMING METHOD

CROSS-REFERENCE TO RELATED APPLICATIONS

This application is based upon and claims the benefit of priority of prior Japanese Patent Application No. 2010-136386, filed on Jun. 15, 2010, the entire contents of which are incorporated herein by reference.

FIELD

The embodiments discussed herein are related to a resin film forming method.

BACKGROUND

In the field of photolithography or nanoimprint lithography, a spin coating method is used to form a thin film on a substrate. In the spin coating method, a thin film is formed in an almost uniform thickness by dropping a solution containing film components onto a substrate while rotating the substrate at a certain speed.

However, the resin thickens in the width of several mm at the edge of the substrate due to the surface tension of the dropping solution. The thick resin on the edge of the substrate is called an edge bead.

Figure 6A:
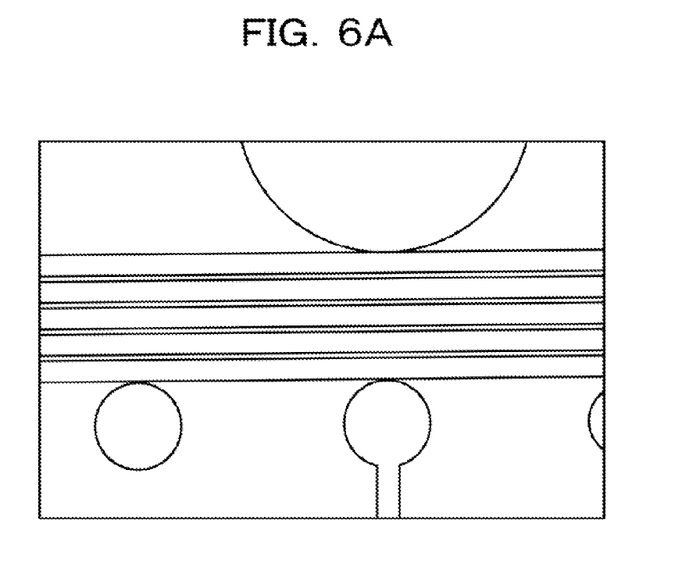
FIG. 6A illustrates the pattern of a resist formed in the embodiment.
Figure 6B:
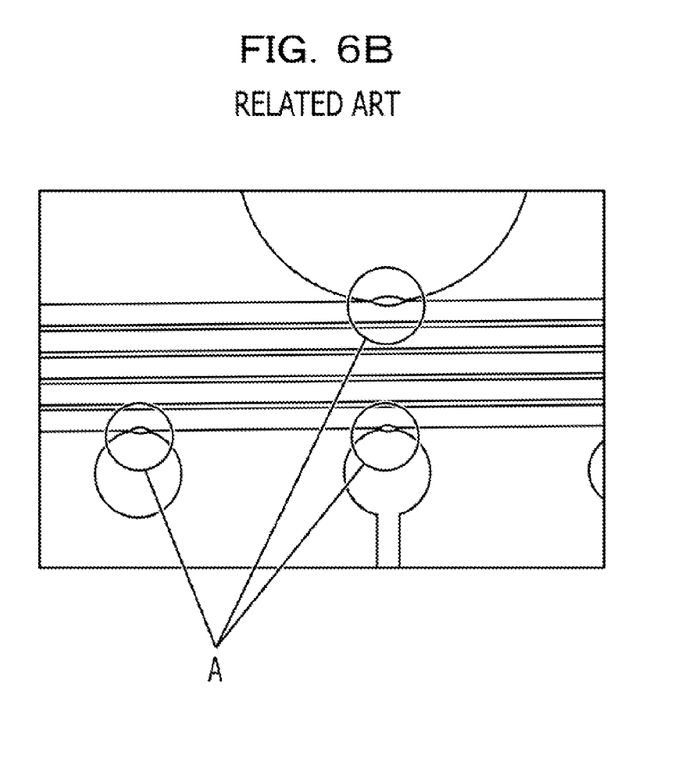
FIG. 6B illustrates the pattern of a resist formed by the conventional method.

When a resin film having an edge bead is used for photolithography or nanoimprint lithography, contact between the resin film and a photomask or mold that may be large relative to the substrate becomes insufficient as illustrated in FIG. 6B, thus affecting patterning accuracy.

Japanese Laid-open Patent Publication No. 2006-80298 discloses the step of dropping a photoresist onto a substrate and spin coating the photoresist while rotating the substrate, the step of removing the photoresist from the circumferential edge of the substrate by supplying a solvent to the circumferential edge of the substrate while rotating the substrate, and the step of drying the surface of the photoresist while rotating the substrate.

In Japanese Laid-open Patent Publication No. 6-163389, a polyimide precursor composition at an end of the surface of a semiconductor substrate is removed with a scraper tool and the semiconductor substrate is successively rotated while the polyimide precursor composition is being spin coated on the surface of the substrate.

In Japanese Laid-open Patent Publication No. 2006-80298, since the photoresist is removed from the circumferential edge of the substrate by supplying the solvent, a portion of the photoresist other than at the circumferential edge of the substrate is also removed. Thus, the thickness of the photoresist becomes non-uniform.

In Japanese Laid-open Patent Publication No. 6-163389, the polyimide precursor composition is physically removed with a scraper tool, and therefore the film thickness of the polyimide precursor composition becomes non-uniform.

SUMMARY

According to an embodiment, a resin film forming method for forming a resin film on a substrate includes forming an intermediate layer on the substrate which includes an inorganic composition as a main component to chemically bond the resin film to be formed on the substrate to the substrate, carrying out a treatment on the substrate to remove an edge of the intermediate layer from an edge of the substrate, forming the resin film on the substrate by spin coating, chemically bonding the resin film to the substrate and hardening the resin film, and removing an edge of the resin film from the edge of the substrate by applying vibrations to the hardened resin film.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
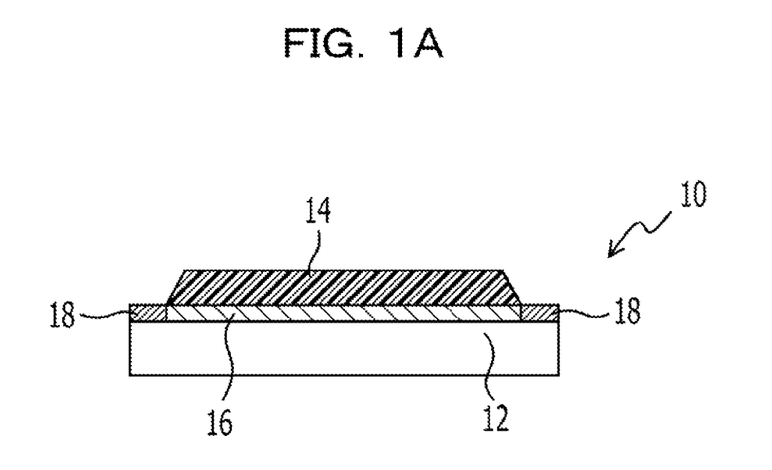
FIG. 1A is a cross sectional view of a resin film-formed substrate of an embodiment.
Figure 1B:
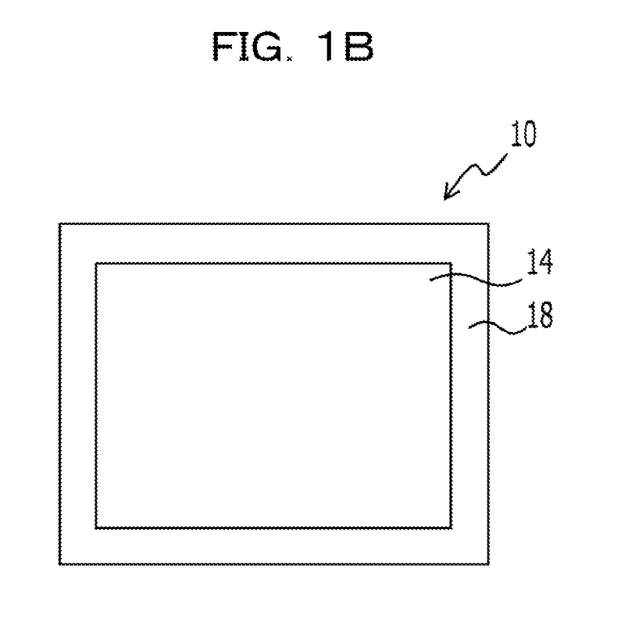
FIG. 1B is a top view of the resin film-formed substrate of the embodiment.

FIGS. 1A and 1B illustrate a resin film-formed substrate 10 formed by a resin film forming method of an embodiment. FIG. 1A is a cross sectional view of the resin film-formed substrate 10, and FIG. 1B is the top view thereof.

The resin film-formed substrate 10 includes a substrate 12, a resin film 14, an adhesion aid layer 16, and a masking material deposited layer 18.

The substrate 12 may be a substrate mainly made of an inorganic composition such as quartz, glass, ceramics and metal, for example. The thickness of the substrate may be, for example, 0.5 to 6.5 mm. The substrate 12 may be rectangular, but the shape of the substrate is not limited thereto. For example, the substrate 12 may be circular or polygonal.

The resin film 14 is formed on the adhesion aid layer 16 on the substrate 12. The resin film 14 may be made of, for instance, a resin material including a phenolnovolak resin, a photosensitive agent, a perfluoroalkyl-containing oligomer, 2-heptanone and 1,4-dioxane as components, or a resin including a phenolnovolak resin, a photosensitive agent, a perfluoroalkyl-containing oligomer, butyl acetate and ethyl lactate as components. The photosensitive agent may include, for instance, a naphthoquinone diazide compound as photosensitive groups.

The adhesion aid layer 16 chemically bonds the resin film 14 to the substrate 12. For the adhesion aid layer 16, a silane coupling agent may be used such as hexamethyldisilazane, 3-methacryloxypropyltrimethoxysilane and 3-acryloxypropyltrimethoxysilane. The silane coupling agent has reactive groups that bond to the resin film 14, and reactive groups that bond to the substrate 12 in one molecule. The reactive groups that bond to the resin film 14 include, for example, a vinyl group, an epoxy group, an amino group, a methacrylic group, a mercapto group, and the like. On the other hand, the reactive groups that bond to the substrate 12 include a methoxy group, an ethoxy group, and the like.

The adhesion aid layer 16 may be thin and may also be thinner than, for instance, 10 nm. The adhesion aid layer 16 is preferably about the thickness of one molecular layer. The adhesion aid layer 16 is made thin so as to chemically bond the resin film 14 to the substrate 12.

The masking material deposited layer 18 is provided so as not to chemically bond to the composition of the resin film 14. The masking material deposited layer 18 is a layer made of masking components that are deposited by partially ashing the adhesion aid layer 16. The masking material deposited layer 18 does not chemically bond to the resin film 14 on the edge of the substrate 12. Therefore, the resin film 14 on the edge can be removed by physically applying external force such as ultrasonic vibrations to the resin film 14 on the edge, for example.

When the resin film 14 on the edge of the substrate 12 is removed, the resin film-formed substrate 10 has no edge bead. Accordingly, a resin film is stably formed at a substantially constant thickness.

The resin film forming method of the embodiment illustrated in FIGS. 1A and 1B will be explained below. FIGS. 2A to 2D and FIGS. 3A to 3D illustrate the resin film forming method. FIG. 4 is a flow chart of the resin film forming method of the embodiment.

Figure 2A:
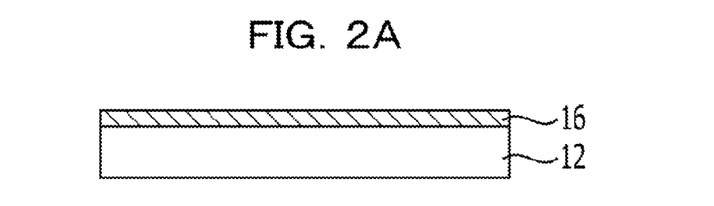
FIGS. 2A to 2D illustrate a part of a resin film forming method of the embodiment.

First, the substrate 12 made of an inorganic composition such as quartz is provided, and the adhesion aid layer 16 is formed thereon by a spin coating method (Step S10). The thickness of the substrate 12 may be in the range of, for instance, 0.5 to 6.35 mm. On a spin coater 22, a solution including hexamethyldisilazane (HMDS) as an adhesion aid is dropped at, for instance, 0.1 to 1 cc, onto the substrate 12 and is spin coated for 60 seconds by the spin coater at, for example, 3000 rpm. Accordingly, the adhesion aid layer 16 may be formed at a thickness of several nm as illustrated in FIG. 2A.

Figure 2B:
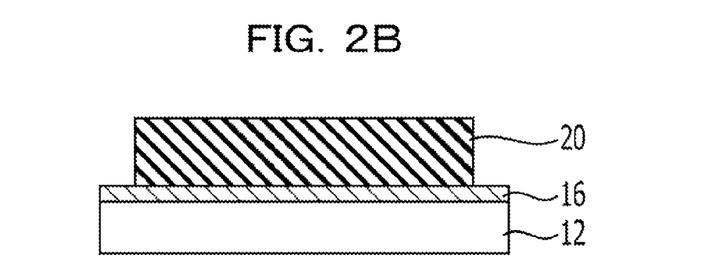

As illustrated in FIG. 2B, a mask 20 is provided on top of adhesion aid layer 16 in a region which does not include the edge of adhesion aid layer 16. Plasma ashing is then carried out (Step S20).

The mask 20 is, for instance, made of a fluorine rubber or a silicone rubber. The mask 20 may be in contact with the adhesion aide layer 16 at 0.1 to 10 mm from the edge of the substrate 12. The mask 20 may have a thickness of 1 to 5 mm, for example.

A parallel flat plate electrode type plasma generating apparatus may be used for plasma ashing. More specifically, for plasma ashing, argon gas and oxygen gas are mixed at a pressure ratio of, for instance, 1:5, and plasma is generated by applying electrical power of 0.3 kW under the pressure of e.g., 45 Pa. The edge of the adhesion aid layer 16 is oxidized by using oxygen radicals generated by the plasma, thus oxidizing the edge of the adhesion aid layer 16. Substantially the same effects are also obtained solely from argon gas, so that the treatment is not limited to oxidation with oxygen radicals. The plasma ashing period is, for example, 0.5 to 1 minute.

Figure 2C:
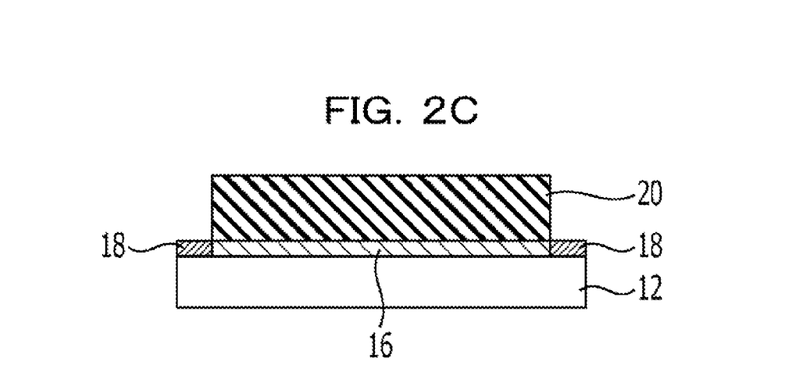

In the plasma ashing, a portion of the mask 20 is sputtered with plasma and is deposited at the edge of the substrate 12. Accordingly, the masking material deposited layer 18 is formed as illustrated in FIG. 2C. The masking material deposited layer 18 may be formed on the remaining adhesion aid layer 16 before the edge of the adhesion aid layer 16 is completely removed by ashing.

Figure 2D:
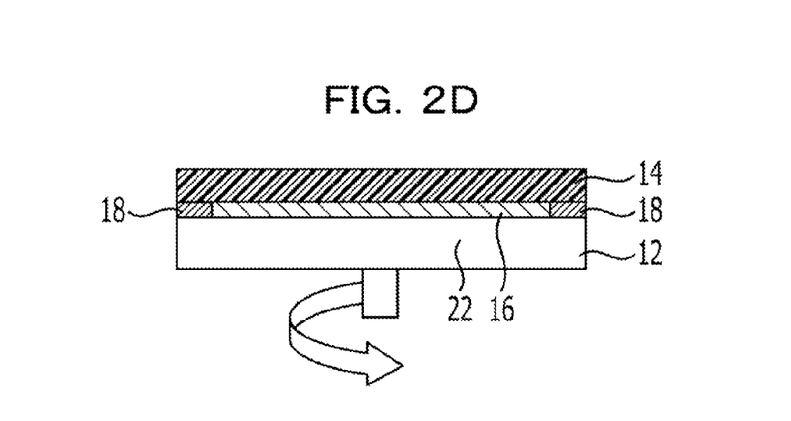

Subsequently, the mask 20 is removed and the resin film 14 is formed on the adhesion aid layer 16 (Step S30). Specifically, the substrate 12 is placed on a spin coater 22 as illustrated in FIG. 2D, and a resin is dropped onto the substrate 12, thus forming the resin film 14 by a spin coating method.

When the resin film 14 is made of a resin material including a phenolnovolak resin, a photosensitive agent, a perfluoroalkyl-containing oligomer, 2-heptanone, and 1,4-dioxane as components, a solution including the phenolnovolak resin at 5 to 45 mass % is dropped onto the adhesion aid layer 16 at 0.3 to 6 cc and is spin coated at 2000 to 5000 rpm for 20 seconds, for example. Accordingly, the resin film 14 may be formed at a thickness of 1.5 to 2.5 μm.

When the resin film 14 is made of a resin material including a phenolnovolak resin, a photosensitive agent, a perfluoroalkyl-containing oligomer, 2-heptanone, and 1,4-dioxane as components, a solution including the phenolnovolak resin at 5 to 40 mass % is dropped onto the adhesion aid layer 16 at 0.3 to 6 cc and is spin coated at 2000 to 5000 rpm for 20 seconds, for example. Thus, the resin film 14 may be formed at a thickness of 1.5 to 2.5 μm.

Figure 3A:
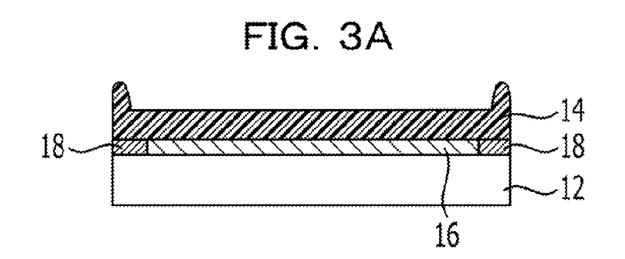
FIGS. 3A to 3D illustrate a part of the resin film forming method of the embodiment.
Figure 4:
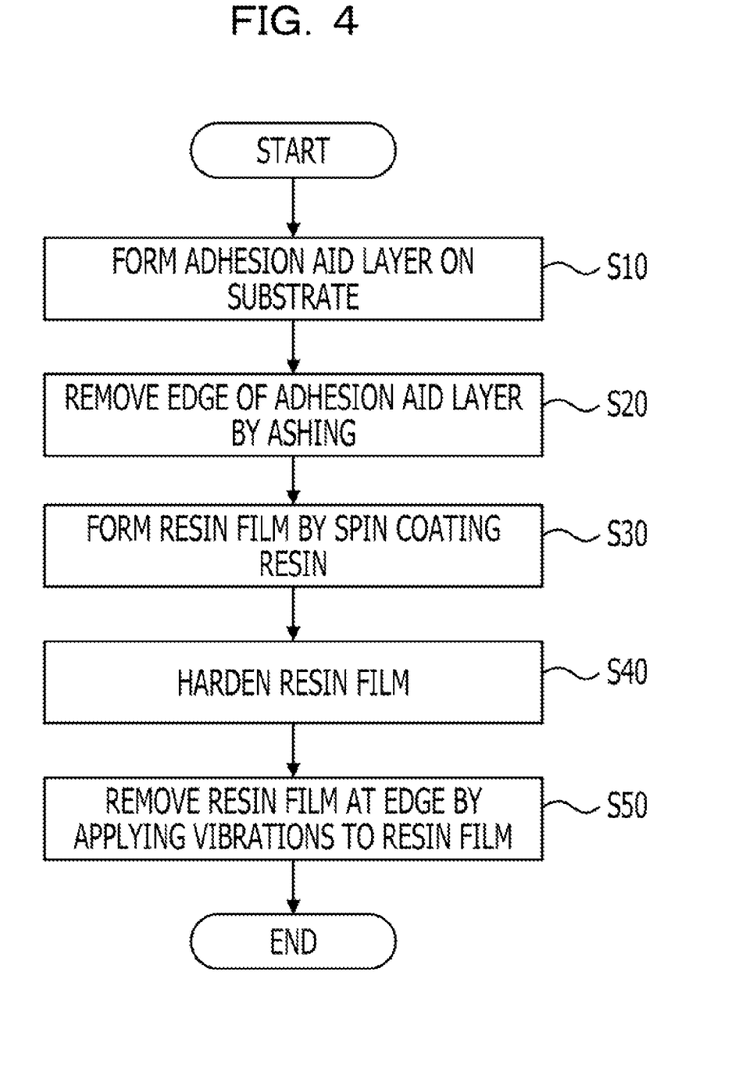
FIG. 4 is a flow chart of the resin film forming method of the embodiment.

The resin film 14 as illustrated in FIG. 3A is thus formed.

Figure 3B:
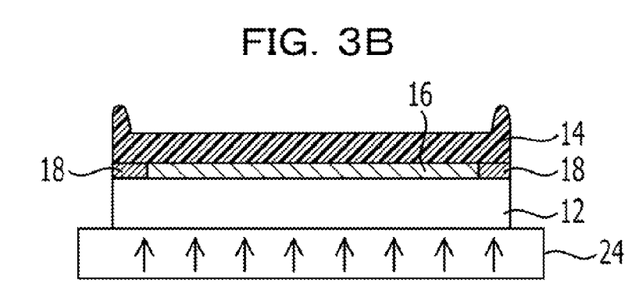

Subsequently, the resin film 14 is hardened (Step S40). More specifically, the substrate 12 formed with the resin film 14 is placed on a heater base 24 as illustrated in FIG. 3B, and is heated at, for instance, 90° C. for 1.5 minutes and is then cooled to room temperature. The resin film 14 is solidified as the solvent is removed from the film. The resin film 14 that is in contact with the adhesion aid layer 16 in a region which does not include the edge of the adhesion aid layer is chemically bonded to the substrate 12 through the reactive groups of the adhesion aid layer 16.

The resin film 14 formed thereby has an edge bead along the edge of the substrate 12 as illustrated in FIG. 3B.

Figure 3C:
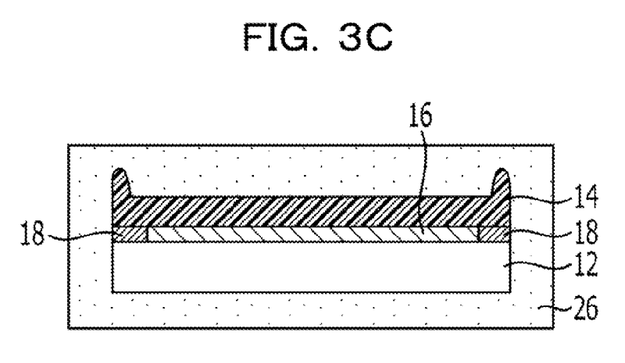

Then, vibrations may be applied to the resin film 14 formed on the substrate 12, thereby removing the edge of the resin film 14 (Step S50). It is preferable to apply ultrasonic vibrations of 28 to 100 kHz to the resin film, for example. It is more preferable to repeatedly apply the vibrations at a plurality of frequencies.

More specifically, ultrasonic waves may be applied to the resin film 14 while the whole substrate 12 is dipped in a liquid 26, such as water, as illustrated in FIG. 3C, thus physically removing the edge of the resin film 14 that is not chemically bonded to substrate 12.

For example, the substrate 12 may be dipped in a liquid in an ultrasonic cleaner, and ultrasonic waves applied at certain frequencies. The frequencies may be, for instance, a plurality of frequencies. When ultrasonic waves are applied, frequencies thereof are changed sequentially per a certain period and the application is repeated. For instance, ultrasonic waves at frequencies such as 28 kHz, 45 kHz, and 100 kHz may be sequentially applied every 10 seconds repeatedly to the resin film 14. The ultrasonic waves may be applied for a total of 10 minutes, for example. More specifically, the ultrasonic waves of 28 kHz may be applied at 0 to 10 seconds; the ultrasonic waves of 45 kHz are applied at 10 to 20 seconds; the ultrasonic waves of 100 kHz may be applied at 20 to 30 seconds; the ultrasonic waves of 28 kHz may be applied at 30 to 40 seconds; and the ultrasonic waves of 45 kHz may be applied at 40 to 50 seconds. This process may be repeated. Thus, the resin film 14 can be completely removed from the edge of substrate 12 as the ultrasonic waves of a plurality of frequencies are sequentially applied repeatedly.

After removing the resin film 14 from the edge of resin film-formed substrate 10, the resin film-formed substrate 10 is taken out from the liquid 26 for drying.

Figure 3D:
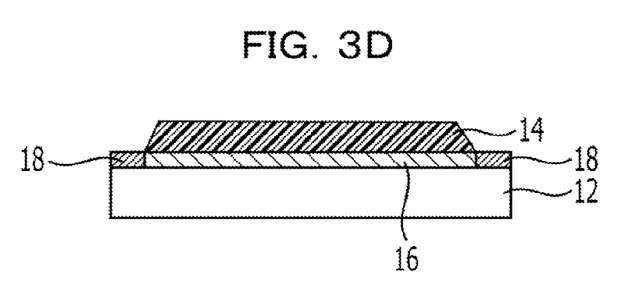

As illustrated in FIG. 3D, the resin film 14, having no edge bead, may thus formed on the substrate 12.

In this resin film forming method, the masking material deposited layer 18 is formed, thus forming a region at the edge of the substrate 12 where the resin film 14 will physically deposit. Additionally, the adhesion aid layer 16 is formed at a region which does not include the edge of substrate 12, thereby forming the region where the resin film 14 will chemically bond to the substrate 12. The resin film 14 deposited on the edge of the substrate 12 may thus be removed by applying vibrations to the film.

A material that does not chemically bond to the resin film 14 may preferably used for the mask 20. In the embodiment, a fluorine rubber or a silicone rubber is used as an example of the material. When HMDS is used as an adhesion aid, a fluorine rubber is more preferable. In the above-mentioned method, the resin film-formed substrate 10 illustrated in FIG. 1 is formed.

A resin film-formed substrate 10 was prepared so as to test the effects of the resin film forming method described above.

The substrate 12 was a quartz plate of 14.5 mm in length× 14.5 mm in width×6.35 mm in thickness.

For the adhesion aid layer 16, HMDS solution was dropped at 0.3 cc and was spin coated for 60 seconds at 3000 rpm by a spin coater. Then, the adhesion aid layer 16 was formed at a thickness of several nm.

A fluorine rubber mask was placed on the adhesion aid layer 16, 1.2 mm apart from the edge of the substrate 12, and ashing was then carried out with a plasma asher (parallel flat plate electrode type plasma generating apparatus). Argon gas and oxygen gas were mixed at the pressure ratio of 1:5, and plasma was generated by applying electric power of 0.3 kW under a pressure of 45 Pa. The treatment period was 0.5 minutes. A masking material deposited layer 18 was formed at the edge of the substrate 12.

Subsequently, the mask 20 was removed. The substrate 12 was then placed on the spin coater 22, and a resin was dropped on the substrate 12 so that the resin film 14 was formed by a spin coating method. The resin was a resin material including a phenolnovolak resin, a photosensitive agent, a perfluoro-alkyl-containing oligomer, 2-heptanone, and 1,4-dioxane as components. A solution including the phenolnovolak resin at 38 mass % was dropped onto the substrate 12 at 0.3 cc and was spin coated at 4000 rpm for 20 seconds. Thus, the resin film 14 was formed at a thickness of about 2 μm.

Then, the substrate 12 formed with the resin film 14 was placed on the heater base 24, and was heated at 90° C. for 1.5 minutes and was then cooled to room temperature. Thus, the resin film 14 that was in contact with the adhesion aid layer 16 at a region which did not include the edge of the adhesion aid layer was chemically bonded to the substrate 12 through the reactive groups of the adhesion aid layer 16.

The substrate 12 which was chemically bonded to the resin film 14 was then dipped in water, and the edge of the resin film 14 was removed by applying ultrasonic waves. Ultrasonic waves at frequencies of 28 kHz, 45 kHz, and 100 kHz were sequentially applied every 10 seconds repeatedly to the resin film 14 for a total of 20 minutes.

Subsequently, the substrate 12 was removed from the water for drying.

Figure 5A:
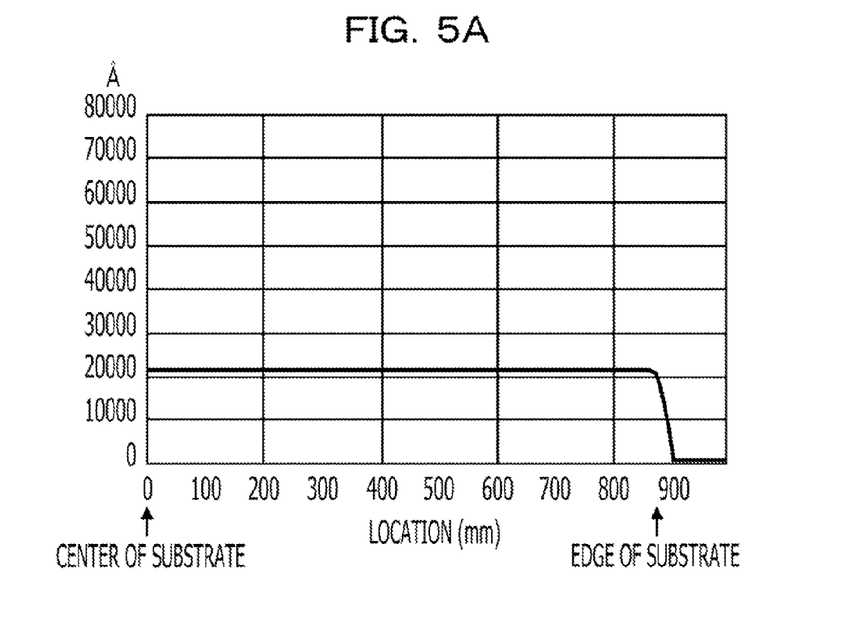
FIG. 5A is a graph illustrating the measurement of surface flatness of the resin film-formed substrate of the embodiment.
Figure 5B:
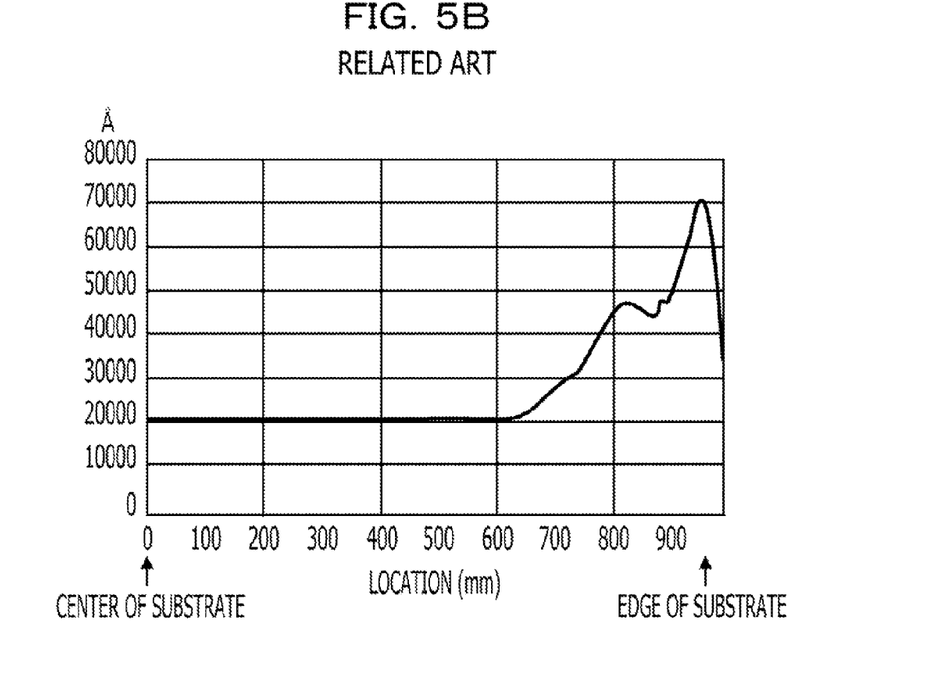
FIG. 5B is a graph illustrating the measurement of surface flatness of a resin film-formed substrate of a conventional method.

FIG. 5A is a graph illustrating the measurement of surface flatness of the resin film 14 formed by the resin film forming method described above. FIG. 5B is a graph illustrating the measurement of surface flatness of a resin film formed on a substrate by a conventional method that does not remove an edge bead. For both measurements, the P22 Automated Surface Profiler manufactured by KLA-TENCOR Corporation was used.

As seen in FIGS. 5A and 5B, the resin film formed by the embodiment of the method described above was removed at the edge of the substrate 12 and had no edge bead. Additionally, the resin film 14 was approximately at a constant thickness. On the contrary, FIG. 5B indicates that an edge bead was formed at a height of about 5 μm at the edge of the substrate using the conventional method.

The resin film 14 formed thereby may be used for e.g., forming a pattern. Specifically, the resin film 14 may be pressed on a mold, and the mold pattern may then be transferred onto the resin film 14, thus forming a pattern on the resin film 14. Alternatively, a pattern may be formed on the resin film 14 by adhering an exposure mask to the resin film 14 and then exposing the resin film 14.

Figure 7A:
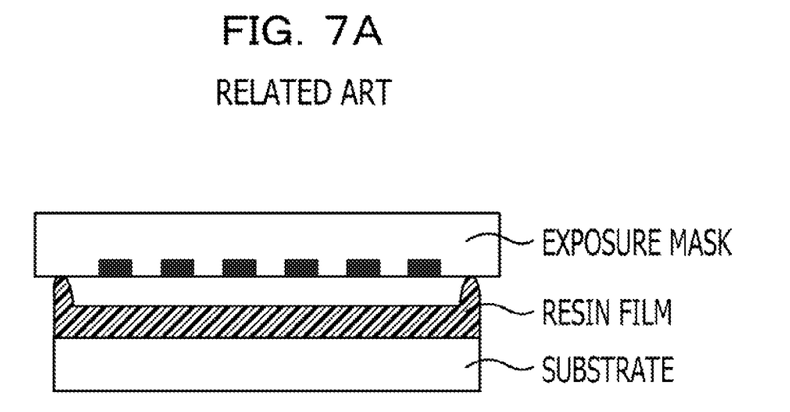
FIGS. 7A and 7B are cross sectional views of the resin film-formed substrate of the conventional method.
Figure 7B:
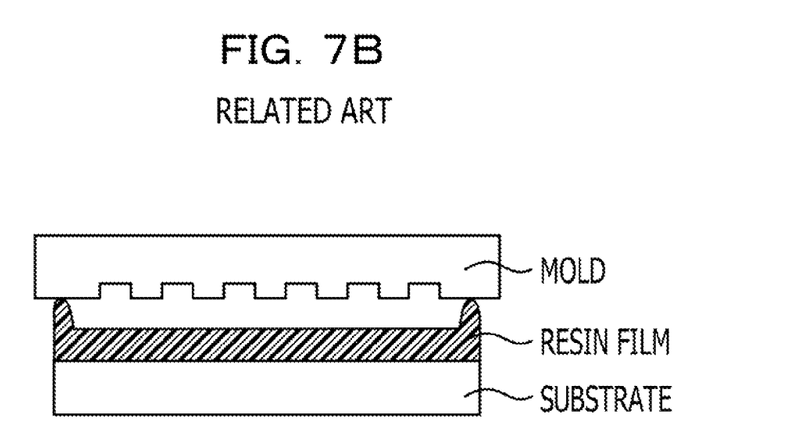

In the conventional method described above in which an edge bead is not removed, a mold or an exposure mask is not fully in contact with the resin film because of the edge bead as illustrated in FIGS. 7A and 7B, so that a pattern is not accurately transferred on the resin film 14. It is also difficult to expose the resin film 14 with accuracy.

FIGS. 6A and 6B illustrate the differences in pattern resolution when the resin films illustrated in FIGS. 5A and 5B are used as a resist in photolithography.

FIG. 6A illustrates a pattern when the resin film formed by the resin film forming method described above is used as a resist. FIG. 6B illustrates a pattern when the resin film formed by the conventional method that does not remove an edge bead, is used as a resist.

As seen from FIGS. 6A and 6B, pattern resolution, in other words, accuracy, is insufficient at regions A in FIG. 6B. That is, due to the edge bead described above, an exposure mask does not adhere to the resin film and a gap is partially formed between the resin film and the exposure mask, lowering the resolution of an exposure pattern on the surface of the resin film.

In the resin film forming method of the embodiment mentioned above, vibrations are applied to remove an edge bead of a resin film, so that a resin film of an even thickness can be formed. In addition, since the edge of the resin film 14 having an edge bead is removed after hardening the film, the film can be stably formed at a uniform thickness.

Moreover, when the resin film is used as a resist in photolithography, the film adheres well to an exposure mask, so that a pattern can be formed with high resolution and accuracy. When the resin film is used as a base material for nanoimprint lithography, the film is well in contact with a mold, so that a pattern can be accurately formed.

Furthermore, the adhesion aid layer 16 is removed from the edge by applying the mask 20, so that the shape of the substrate 12 is not limited to a circle or a rectangle. Thus, the substrate 12 may be of any shape.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiments of the present inventions have been described in detail, it should be understood that various changes, substitutions, and alterations could be made hereto without departing from the spirit and scope of the invention.

What is claimed is:

1. A resin film forming method for forming a resin film over a substrate, the method comprising:
    forming an intermediate layer on the substrate which includes an inorganic composition as a main component to chemically bond the resin film to be formed over the substrate to the substrate;
    covering the intermediate layer with a mask in a region which does not include an edge of the intermediate layer and carrying out an ashing process on the edge of the intermediate layer;
    forming the resin film over the substrate by spin coating;
    chemically bonding the resin film to the substrate and hardening the resin film; and
    removing an edge of the resin film from the edge of the substrate by applying vibrations to the hardened resin film.

2. The resin film forming method according to claim 1, wherein a masking material deposited layer is formed on the edge of the substrate during the ashing process from the mask that is used for the ashing.

3. The resin film forming method according to claim 2, wherein the masking material deposited layer includes components that do not chemically bond to the resin film.

4. The resin film forming method according to claim 1, wherein the intermediate layer includes a silane coupling agent, and the mask includes a fluorine rubber or a silicone rubber.

5. The resin film forming method according to claim 1, wherein ultrasonic vibrations of 28 to 100 kHz are applied to the resin film to remove the edge of the resin film.

6. A pattern forming method for forming a pattern over a substrate, the method comprising:
    forming an intermediate layer on the substrate which includes an inorganic composition as a main component to chemically bond a resin film to be formed over the substrate to the substrate;
    covering the intermediate layer with a mask in a region which does not include an edge of the intermediate layer and carrying out an ashing process on the edge of the intermediate layer;
    forming the resin film over the substrate by spin coating;
    chemically bonding the resin film to the substrate and hardening the resin film;
    removing an edge of the resin film from the edge of the substrate by applying vibrations to the hardened resin film; and
    forming a pattern on the resin film by pressing the resin film on a mold and transferring a mold pattern thereto.

7. A pattern forming method of forming a pattern over a substrate, the method comprising:
    forming an intermediate layer on the substrate which includes an inorganic composition as a main component to chemically bond a resin film to be formed over the substrate to the substrate;
    covering the intermediate layer with a mask in a region which does not include an edge of the intermediate layer and carrying out an ashing process on the edge of the intermediate layer;
    forming the resin film over the substrate by spin coating;
    chemically bonding the resin film to the substrate and hardening the resin film;
    removing an edge of the resin film from the edge of the substrate by applying vibrations to the hardened resin film; and
    forming a pattern on the resin film by adhering an exposure mask to the resin film and exposing the resin film.

* * * * *